United States Patent
Sasaki

(10) Patent No.: US 6,742,980 B2
(45) Date of Patent: Jun. 1, 2004

(54) METHOD FOR ALIGNING CONVEYING POSITION OF OBJECT PROCESSING SYSTEM, AND OBJECT PROCESSING SYSTEM

(75) Inventor: Yoshiaki Sasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 92 days.

(21) Appl. No.: 10/088,892
(22) PCT Filed: Oct. 11, 2001
(86) PCT No.: PCT/JP01/08915
§ 371 (c)(1), (2), (4) Date: Mar. 25, 2002

(65) Prior Publication Data
US 2002/0136629 A1 Sep. 26, 2002

(30) Foreign Application Priority Data
Oct. 11, 2000 (JP) .......................................... 2000-311146

(51) Int. Cl.$^7$ ................................................. B25J 9/00
(52) U.S. Cl. ........................ 414/783; 414/936; 414/816; 700/218; 700/254
(58) Field of Search ................................. 414/754, 783, 414/936, 816; 700/218, 254

(56) References Cited

FOREIGN PATENT DOCUMENTS

| JP | 07-193112 | 7/1995 |
| JP | 9-252039 | 9/1997 |
| JP | 2000-127069 | 5/2000 |

*Primary Examiner*—Donald W. Underwood
(74) *Attorney, Agent, or Firm*—Finnegan, Henderson, Farabow, Garrett, & Dunner, L.L.P.

(57) ABSTRACT

There is provided a processing system for processing a processing object, capable of precisely and efficiently carrying out alignment during a teaching operation.

In a processing system for processing a processing object, the processing system comprising: processing apparatuses 12A and 12B, which have supporting tables 14A and 14B for supporting thereon objects to be processed, respectively, and which serve to carry out a predetermined processing for the processing objects; an orienter/positioner 32 for detecting an eccentric quantity and eccentric direction of the processing object mounted on a reference table 52; at least one transfer mechanism 20, 40A, 40B provided between the orienter/positioner and the processing apparatus; and a control part 70 for controlling the transfer mechanism and the orienter/positioner, the control part obtains a position shift quantity of the aligning substrate when the transfer mechanism causes the to-and-fro conveyance of the aligning substrate between the reference table and the supporting table to return the aligning substrate, as a to-and-fro position shift quantity, and obtains a position shift quantity of the aligning substrate when the aligning substrate precisely aligned to be mounted on the supporting table is conveyed to the reference table by the transfer mechanism, as a one-way position shift quantity, the control part modifying an conveying position of a processing object, which is conveyed toward the supporting table by the transfer mechanism, on the basis of the to-and-fro position shift quantity and the one-way position shift quantity. Thus, alignment during a teaching operation is precisely and efficiently carried out.

7 Claims, 7 Drawing Sheets

METHOD FOR ALIGNING CONVEYING POSITION OF OBJECT PROCESSING SYSTEM, AND OBJECT PROCESSING SYSTEM

TECHNICAL FIELD

The present invention relates generally to an aligning method carried out in a conveying mechanism for conveying a semiconductor wafer or the like. More specifically, the invention relates to a method for aligning the conveying position of a processing system for processing a processing object, the method being capable of rapidly aligning the conveying position of the conveying mechanism, and a processing system for processing a processing object.

BACKGROUND ART

In general, an apparatus for fabricating a semiconductor device has various processing apparatuses combined with each other, and is provided with a transfer mechanism for automatically delivering semiconductor wafers between the processing apparatuses and between a cassette for housing therein a large number of semiconductor wafers and the processing apparatuses. The transfer mechanism has a transfer arm portion which is capable of bending and stretching, swiveling and vertically moving, and is horizontally moved to a transfer position to convey and transfer the wafers to a predetermined position.

In this case, it is not only required to avoid the interference or collision of the transfer arm portion with other members during the movement of the transfer arm portion, but it is also required to appropriately hold wafers, which are arranged in a certain place, and convey the wafers to a target position to deliver and transfer the wafers to an appropriate place with precision within a shift quantity of, e.g., ±0.2 to 0.3 mm. Some of conveying paths have a transfer mechanism capable of only bending and stretching and swiveling, or a transfer mechanism capable of vertically moving in addition to the bending and stretching and swiveling.

For that reason, there is carried out an operation called a so-called teaching operation for causing a control part, such as a computer, for controlling the movement of the transfer arm portion, to learn important positions, such as places at which wafers are transferred in the conveying paths of the transfer arm portion, as position coordinates.

This teaching operation is carried out with respect to almost all cases for transferring wafers, such as the positional relationship between the transfer arm portion and a cassette vessel, the positional relationship in vertical directions between the arm portion and the cassette for taking the wafers, the positional relationship between a supporting table in a load-lock chamber and the arm portion, and the positional relationship between the arm portion of the transfer mechanism in the load-lock chamber and the supporting table in a processing apparatus, and their position coordinates are stored. Of course, all of driving systems include an encoder or the like for assigning the driving positions. As teaching methods of this type are disclosed in, e.g., Japanese Patent Laid-Open Nos. 7-193112, 9-252039 and 2000-127069.

Specifically, a certain point on the moving path of the transfer arm portion is first used as an absolute reference for obtaining the position coordinates of a place to be taught in the whole apparatus, from designed values of the apparatus, and for causing the obtained position coordinates to be inputted to and stored in the control part as temporary position coordinates to carry out a rough teaching operation. In this case, the temporary position coordinates are inputted in view of predetermined margins so that the wafers held by the arm do not interfere with other members.

Then, the transfer arm portion is driven on the basis of the temporary position coordinates while an aligning substrate of, e.g., a transparent plastic, having a shape similar to the shape of a semiconductor wafer to be conveyed is appropriately held on the arm portion. If the transfer arm portion moves to the vicinity of the supporting table, the operation of the transfer arm portion is switched to a manual operation so as to allow fine movement, and the transfer arm portion is manually operated so that the central position of the substrate which is previously marked on the surface of the substrate is coincident with the central position which is previously marked on the supporting table, while viewing from a lateral direction or a vertical direction. When both centers are coincident with each other, the coordinates are stored in the control portion as precise and appropriate position coordinates to carry out a teaching operation. In this case, there are some cases where the transfer arm portion is slowly moved to the vicinity of the supporting table from the beginning by manual operations. In the middle of the wafer conveying path, such a teaching operation is carried out by manual operation and visual observation every place to which the wafers are transferred or delivered, to align the transfer position.

In the teaching operation when wafers are conveyed and transferred from the supporting table of the processing apparatus, the substrate is arranged at an appropriate place on the supporting table by visual observation or by means of a camera mechanism as shown in Japanese Patent Laid-Open No. 7-193112, and the substrate is conveyed to the vicinity of the transfer position by means of the transfer arm portion. Then, as described above, the transfer arm portion is operated by visual operation so that the central position of the substrate is coincident with the central position of the transfer place. When both centers are coincident with each other, the coordinates are stored in the control part as appropriate position coordinates to carry out a teaching operation.

For that reason, in the above described conventional aligning method, there is a problems in that it takes a very long time since delicate alignment is carried out by swiveling and/or bending and stretching the arm while carrying out visual observation.

There is also a problem in that alignment precision is greatly varied with individual differences. Moreover, since the transfer arm portion rapidly moves in an actual operation during process, an inertia force acts thereon, so that there are some cases where a transfer position during a slow manual teaching operation is slightly shifted from a transfer position during an actual operation in which an inertia force greatly acts on the transfer arm portion.

When the transfer position is manually aligned, the transfer arm portion is delicately aligned while being moved forward and backward in the vicinity of the transfer position. On the other hand, in an actual operation during process, the transfer arm portion is not moved forward and backward, and the transfer arm portion travels in one direction to stand so that the transfer arm portion is rapidly decelerated from a rapid movement to be stopped. Therefore, there are some cases where during a teaching operation, a so-called back lash is caused in gears and so forth constituting the transfer arm portion, and this error enters the position of coordinates to cause alignment errors.

Moreover, when a plastic plate or the like is used as the aligning substrate, the weight and rigidity of the substrate are different from those of wafers. Therefore, for example, deflection is different from each other, so that there is a problem in that the transfer position is shifted.

DISCLOSURE OF THE INVENTION

The present invention has been made in order to effectively solve the above described problems. It is an object of the present invention to provide a method for aligning the conveying position of a processing system for processing a processing object, the method being capable of precisely and efficiently carrying out alignment during a teaching operation.

After the inventors have diligently studied an aligning method during teaching, the inventors have found that if precise alignment is carried out on a supporting table of a processing apparatus which is a final destination, even if an allowable position shift is caused on a buffer supporting table in the middle of a conveying path for semiconductor wafers, this can be ignored, and have made the present invention.

According to a first aspect of the present invention, there is provided a method for aligning a conveying position of a processing system for processing a processing object, the processing system comprising a processing apparatus which has a supporting table for supporting thereon the processing object and which serves to carry out a predetermined processing for the processing object, an orienter/positioner for detecting an eccentric quantity and eccentric direction of the processing object mounted on a reference table, and at least one transfer mechanism which is provided between the orienter/positioner and the processing apparatus, the method comprising the steps of: obtaining a position shift quantity of an aligning substrate when the transfer mechanism causes the to-and-fro conveyance of the aligning substrate between the reference table and the supporting table to return the aligning substrate, as a to-and-fro position shift quantity; obtaining a position shift quantity of the aligning substrate when the aligning substrate precisely aligned to be mounted on the supporting table is conveyed to the reference table by the transfer mechanism, as a one-way position shift quantity; and modifying an conveying position of a processing object, which is conveyed toward the supporting table by the transfer mechanism, on the basis of the to-and-fro position shift quantity and the one-way position shift quantity.

The present invention intends to allow the processing object conveyed to the top of the supporting table to precisely positioned to be conveyed when the processing object mounted on the reference table is conveyed to the supporting table by the transfer mechanism, so that the processing object can be smoothly processed in the processing apparatus by precisely positioning the processing object on the supporting table.

On the reference table, the eccentric quantity and eccentric direction of the processing object can be detected by the orienter/positioner. On the other hand, it is not easy to detect the eccentric quantity and eccentric direction of the processing object mounted on the supporting table. Therefore, according to the present invention, the position shift quantity of the aligning substrate when the transfer mechanism causes the to-and-fro conveyance of the aligning substrate between the reference table and the supporting table to return the aligning substrate is obtained as a to-and-fro position shift quantity, and the position shift quantity of the aligning substrate when the aligning substrate precisely aligned to be mounted on the supporting table is conveyed to the reference table by the transfer mechanism is obtained as a one-way position shift quantity, so that the processing object can be precisely positioned to be conveyed to the top of the supporting table.

Thus, the conveying position during the conveyance of the processing object toward the supporting table is modified on the basis of the to-and-fro position shift quantity caused when the to-and-fro conveyance of the processing object is carried out between the reference table of the orienter/positioner and the supporting table of the processing apparatus, and on the basis of the one-way position shift quantity caused when the one-way conveyance of the processing object is carried out from the supporting table toward the reference table. Therefore, it is possible to rapidly and precisely carry out a teaching operation without causing individual differences.

During alignment in the teaching operation, the aligning substrate is conveyed at the same conveying speed as that during process, and adjustment for delicately moving the aligning substrate forward and backward by manual operations is not carried out. Therefore, it is possible to precisely carry out alignment without causing position errors caused by the difference in inertia force and position errors caused by a back lash.

For example, the processing system may have a plurality of processing apparatuses, each of which is said processing apparatus, for modifying the conveying position with respect to a conveying path to each of the supporting tables.

In the above described cases, the modified quantity corresponds to a difference between the to-and-fro position shift quantity and the one-way position shift quantity.

For example, a plurality of transfer mechanism may be provided between the orienter/positioner and each of the processing apparatus, and a buffer supporting table for causing the processing object to be standby on the way may be provided therebetween, the aligning substrate being conveyed by means of the plurality of transfer mechanisms and the buffer supporting table.

Thus, even if the plurality of transfer mechanisms and buffer supporting tables are associated with each other to be provided in the middle of the conveying paths, it is not required to carry out alignment on each of the buffer supporting tables, so that it is possible to greatly shorten the time required to carry out alignment in the teaching operation.

For example, an actual processing object is used as the aligning substrate.

Thus, since the actual processing object is used unlike the conventional case where the plastic plate or the like is used as the aligning substrate, the thickness, dimension and rigidity are the same as those of the processing object during process. Therefore, the deflection quantity and so forth during alignment in the teaching operation are the same, so that it is possible to more precisely carry out alignment.

According to a second aspect of the present invention, an apparatus for carrying out the method according to the present invention is provided. That is, the processing system comprises: a processing apparatus which has a supporting table for supporting thereon a processing object and which serves to carry out a predetermined processing for the processing object; an orienter/positioner for detecting an eccentric quantity and eccentric direction of the processing object mounted on a reference table; at least one transfer mechanism which is provided between the orienter/positioner and the processing apparatus; and a control part for controlling the transfer mechanism and the orienter/ positioner, wherein the control part obtains a position shift quantity of the aligning substrate when the transfer mechanism causes the to-and-fro conveyance of the aligning substrate between the reference table and the supporting table to return the aligning substrate, as a to-and-fro position shift quantity, and obtains a position shift quantity of the aligning substrate when the aligning substrate precisely aligned to be mounted on the supporting table is conveyed to the reference table by the transfer mechanism, as a one-way position shift quantity, the control part modifying an conveying position of a processing object, which is conveyed toward the supporting table by the transfer mechanism, on the basis of the to-and-fro position shift quantity and the one-way position shift quantity.

In this case, for example, a plurality of processing apparatus, each of which is said processing apparatus, are provided, and the transfer mechanism comprises: a common conveying mechanism which is commonly used for each of the processing apparatuses; and separate transfer mechanisms, each of which is provided so as to correspond to each of the processing apparatuses, each of the separate transfer mechanisms being provided with a buffer supporting table for temporarily supporting thereon the processing object.

BEST MODE FOR CARRYING OUT THE INVENTION

Referring to the accompanying drawings, a preferred embodiment of a method for aligning the conveying position of a processing system for processing a processing object, and a processing system for processing a processing object, according to the present invention will be described below in detail.

Figure 1:
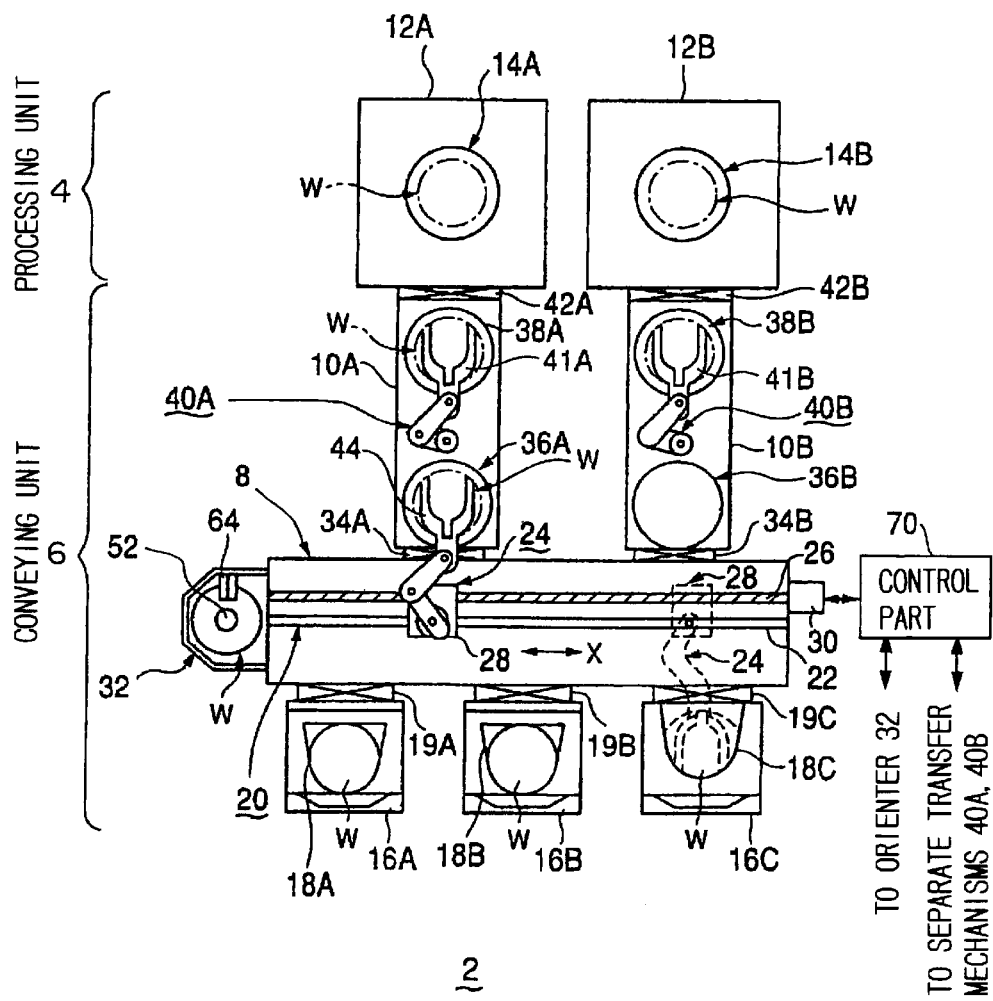
FIG. 1 is a schematic view showing a processing system for processing a processing object, which is used for carrying out a method according to the present invention.
Figure 2:
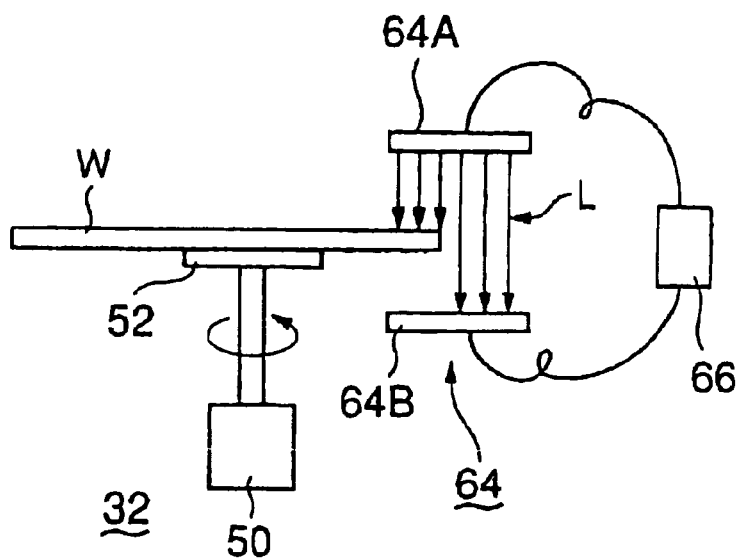
FIG. 2 is a side view showing an orienter/positioner.
Figure 3:
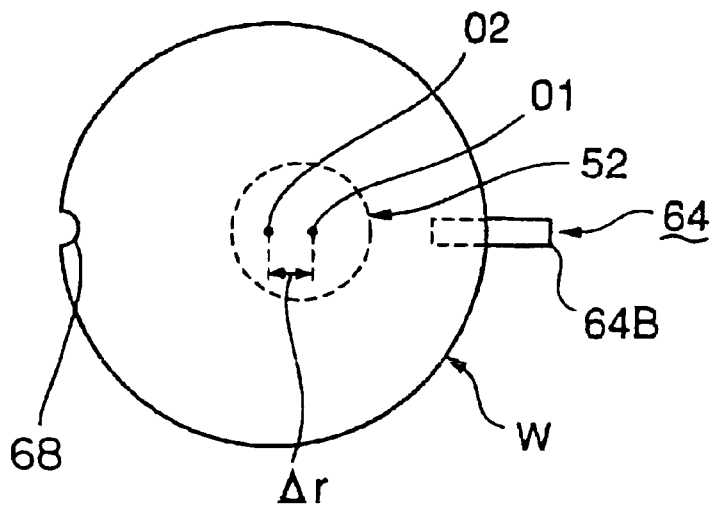
FIG. 3 is a plan view showing a state that an object to be conveyed is mounted on the orienter/positioner.

FIG. 1 is a schematic view showing a processing system for processing a processing object, which is used for carrying out a method according to the present invention. FIG. 2 is a side view showing an orienter/positioner, and FIG. 3 is a plan view showing a state that a processing object is mounted on the orienter/positioner. A case where semiconductor wafers are herein used as objects to be processed and an actual semiconductor wafer (dummy substrate) is used as an aligning substrate will be described below.

First, referring to FIG. 1, a processing system for processing a processing object will be described below. This processing system 2 mainly comprises a processing unit 4 for carrying out various processes, such as deposition and etching, for semiconductor wafers W serving as objects to be processed, and a conveying unit 6 for carrying the wafers in and out of the processing unit 4. The conveying unit 6 mainly comprises a common transfer chamber 8 commonly used when the wafers W are conveyed, and a plurality of (two in the figure) load-lock chambers 10A and 10B which are connected to the common transfer chamber 8 and which are capable of being evacuated.

The processing unit 4 comprises two processing apparatuses 12A and 12B, in each of which the same kind or different kinds of processes are carried out for the wafers W. In the processing apparatuses 12A and 12B, supporting table 14A and 14B for supporting thereon the wafers W are provided, respectively.

On the other hand, the common transfer chamber 8 of the conveying unit 6 is formed of a laterally elongated box in which an inert gas, such as $N_2$ gas, and clean air are circulated. One side of the laterally elongated box is provided with cassette tables 16A, 16B and 16C for supporting thereon a plurality of (three in the figure) cassette vessels, respectively. On the cassette tables 16A through 16C, the cassette vessels 18A through 18C are capable of being mounted, respectively. Each of the cassette vessels 18A through 18C is capable of supporting and housing a maximum of, e.g., 25 wafers W, at regular intervals in the form of multistage, and has a closed structure which is filled with, e.g., $N_2$ gas. The wafers W are capable of being carried in and out of the common transfer chamber 8 via gate valves 19A through 19C.

In the common transfer chamber 8, a common conveying mechanism 20 for conveying the wafers W in its longitudinal directions is provided. The common conveying mechanism 20 has a guide rail 22 which extends along the central portion in the common transfer chamber 8 in longitudinal directions, and the common conveying arm portion 24 is slidably supported on the guide rail 22. The guide rail 22 is provided with a moving mechanism, e.g., a ball screw 26, in parallel thereto. The base 28 of the common conveying arm portion 24 is inserted into the ball screw 26. Therefore, by rotating a drive motor 30 provided on the end portion of the ball screw 26, the common conveying arm portion 24 moves along the guide rail 22 in X directions.

One end of the common transfer chamber 8, an orienter 32 serving as an orienter/positioner for aligning wafers is provided. In the middle of the common transfer chamber 8 in longitudinal directions, gate valves 34A and 34B, which are capable of opening and closing the two load-lock chambers 10A and 10B capable of being evacuated, are provided for connecting the two processing apparatuses 12A and 12B, respectively. In each of the load-lock chambers 10A and 10B, a pair of buffer supporting tables 36A, 38A and 36B, 38B for temporarily supporting thereon the wafers W to allow the wafers W to be on standby. It is assumed that the buffer supporting tables 36A and 36B on the side of the common transfer chamber 8 are first buffer supporting tables, and the buffer supporting tables 38A and 38B on the opposite side are second buffer supporting tables. Between the buffer supporting tables 36A and 38A and between the buffer supporting tables 36B and 38B, there are provided separate transfer mechanisms 40A and 40B, each of which comprises an articulated arm capable of bending and stretching, swiveling and vertically moving, respectively. By using forks 41A and 41B provided on the tips of the separate transfer mechanisms 40A and 40B, the wafers W are delivered and transferred between the first and second buffer transferring tables 36A, 38A and 36B, 38B. The other ends of the load-lock chambers 10A and 10B are connected to the processing apparatuses 12A and 12B via gate valves 42A and 42B capable of being open and closed, respectively. The wafers are carried in and out of the processing apparatuses 12A and 12B by means of the separate transfer mechanisms 40A and 40B, which are provided so as to correspond to the processing apparatuses 12A and 12B, respectively.

The common conveying mechanism 20 has a fork 44, which is mounted on the tip thereof, so as to hold the wafers W directly on the fork 44. Although only one fork 44 is provided in the shown embodiment, two forks 44 may be provided. The fork 44 is movable in X directions extending along the guide rail 22, in Z directions which are vertical directions of the base 28, in θ directions which are swivel directions with respect to the base 28, and in R directions which are radial directions from the center of the common conveying mechanism 20. Therefore, all of position coordinates are expressed as coordinates of X, Z, R and θ. Of course, the coordinates on the respective axes can recognize a displacement quantity from a preset reference point by, e.g., an encoder.

Also as shown in FIGS. 2 and 3, the orienter 32 has a reference table 52 rotated by a drive motor 50, and is designed to rotate while supporting thereon the wafer W. On the outer periphery of the reference table 52, an optical sensor 64 for detecting the peripheral edge portion of the wafer W. The optical sensor 64 comprises a linear light emitting element 64A which extends in radial directions of the reference table 52 and which has a predetermined length, and a light receiving element 64B which faces the light emitting element 64B via the peripheral edge portion of the wafer, The optical sensor 64 can irradiate the edge portion of the wafer with curtain-like laser beams L to detect the fluctuation therein. A detecting/calculating part 66 can recognize the eccentric quantity and eccentric direction of the wafer W, and the rotational position, i.e., orientation, of, e.g., a notch 68, serving as a cut-out mark formed in the wafer W.

In FIG. 3, O1 denotes the center (rotational center) of the reference table 52, and O2 denotes the center of the wafer W. Therefore, the eccentric quantity is Δr. Although the cut-out mark is the notch 68 in a 12-inch wafer, it is a notch or orientation flat in an 8-inch or 6-inch wafer.

Referring to FIG. 1 again, in order to control the movement of the whole processing system including the positioning operation of the orienter 32, the common conveying mechanism 20 and the respective transfer mechanisms 40A and 40B, a control part 70 comprising, e.g., a microcomputer, is provided. In the control part 70, there are stored position coordinates and so forth necessary for a positioning teaching operation which will be described later.

Also referring to FIGS. 4 through 9, a method for aligning a conveying position according to the present invention, which is carried out by means of the above described processing system 2, will be described below.

Figure 4:
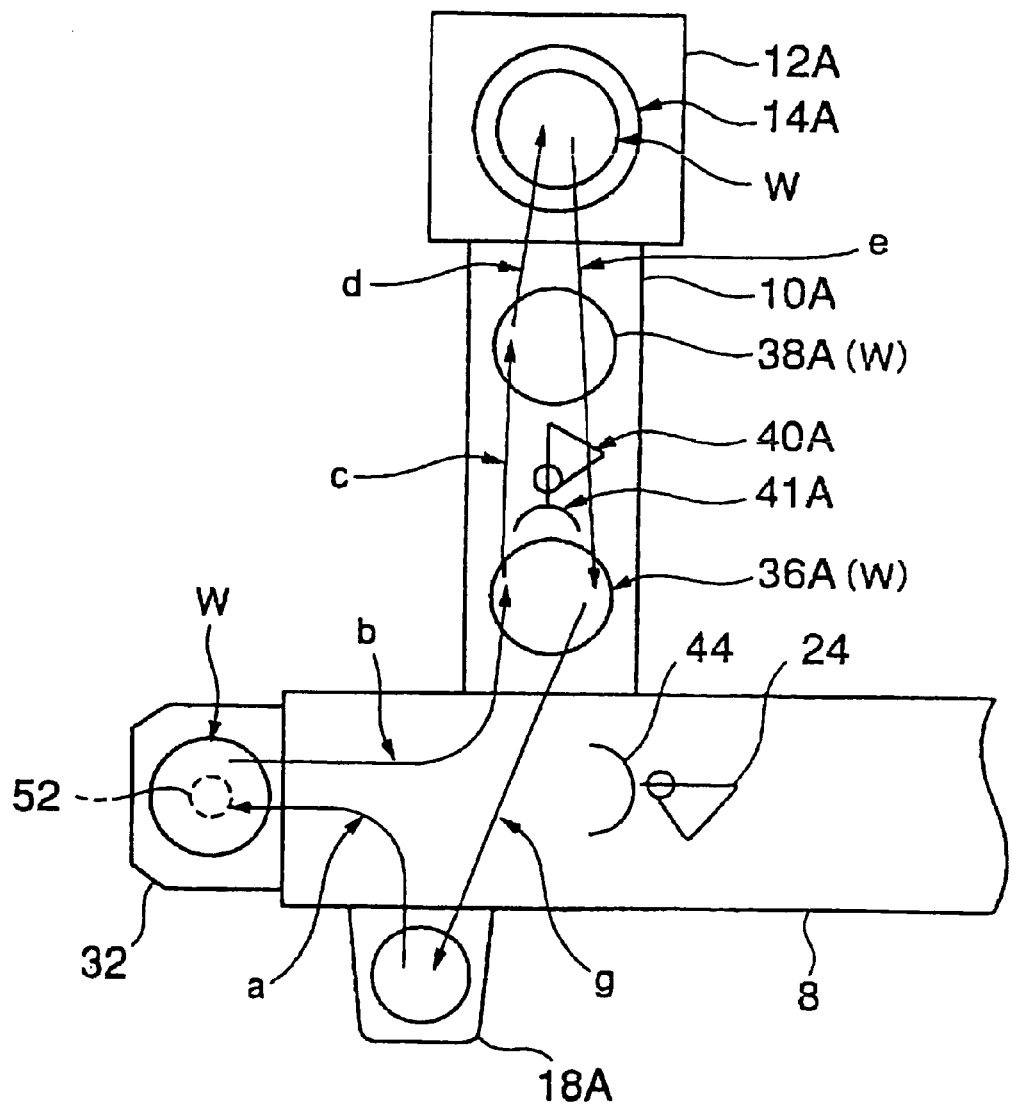
FIG. 4 is a schematic view showing an example of a typical moving path for wafers W during an actual process.
Figure 5:
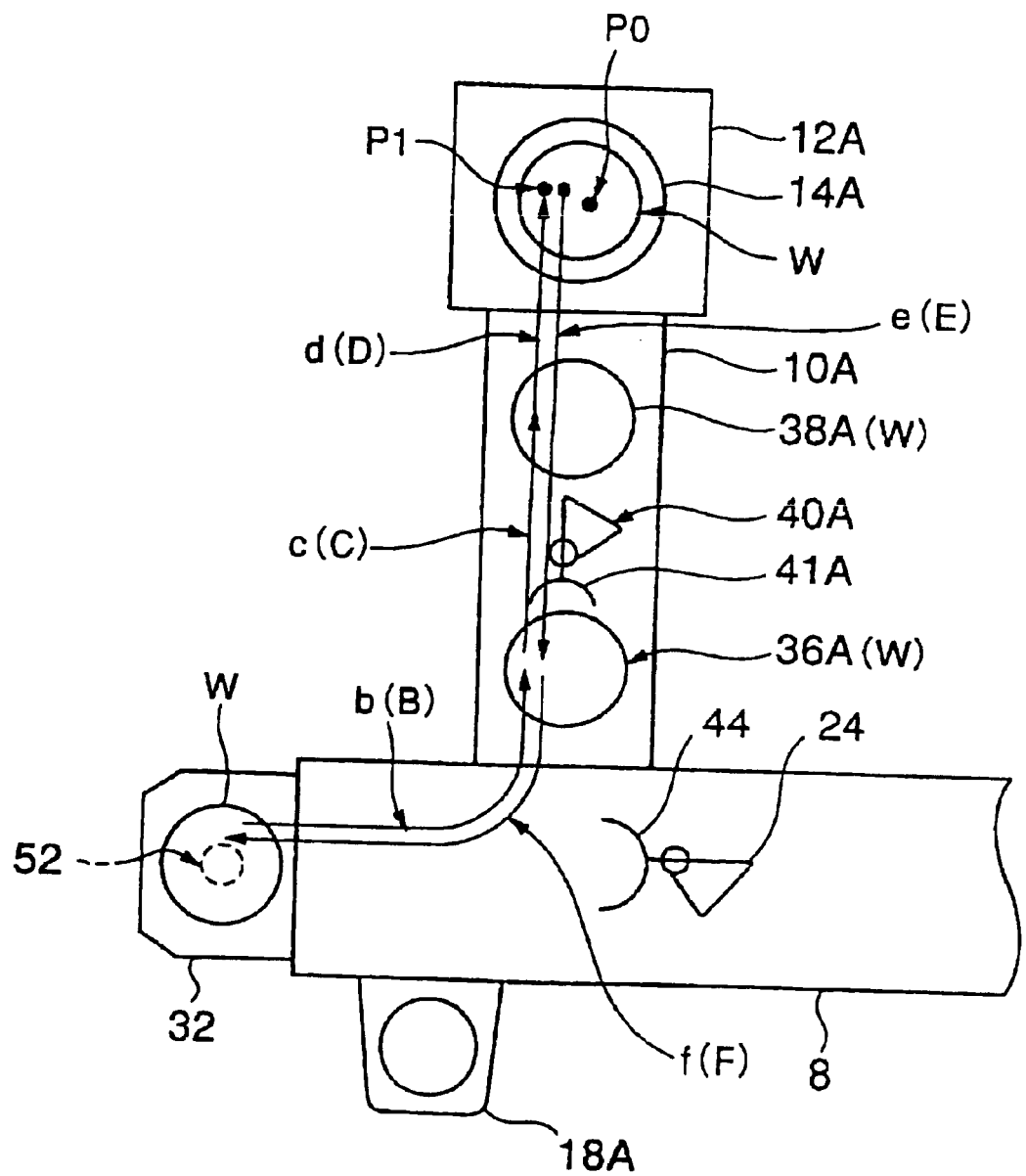
FIG. 5 is a schematic view showing an example of a moving path when a to-and-fro position shift is obtained in an aligning method according to the present invention.
Figure 6:
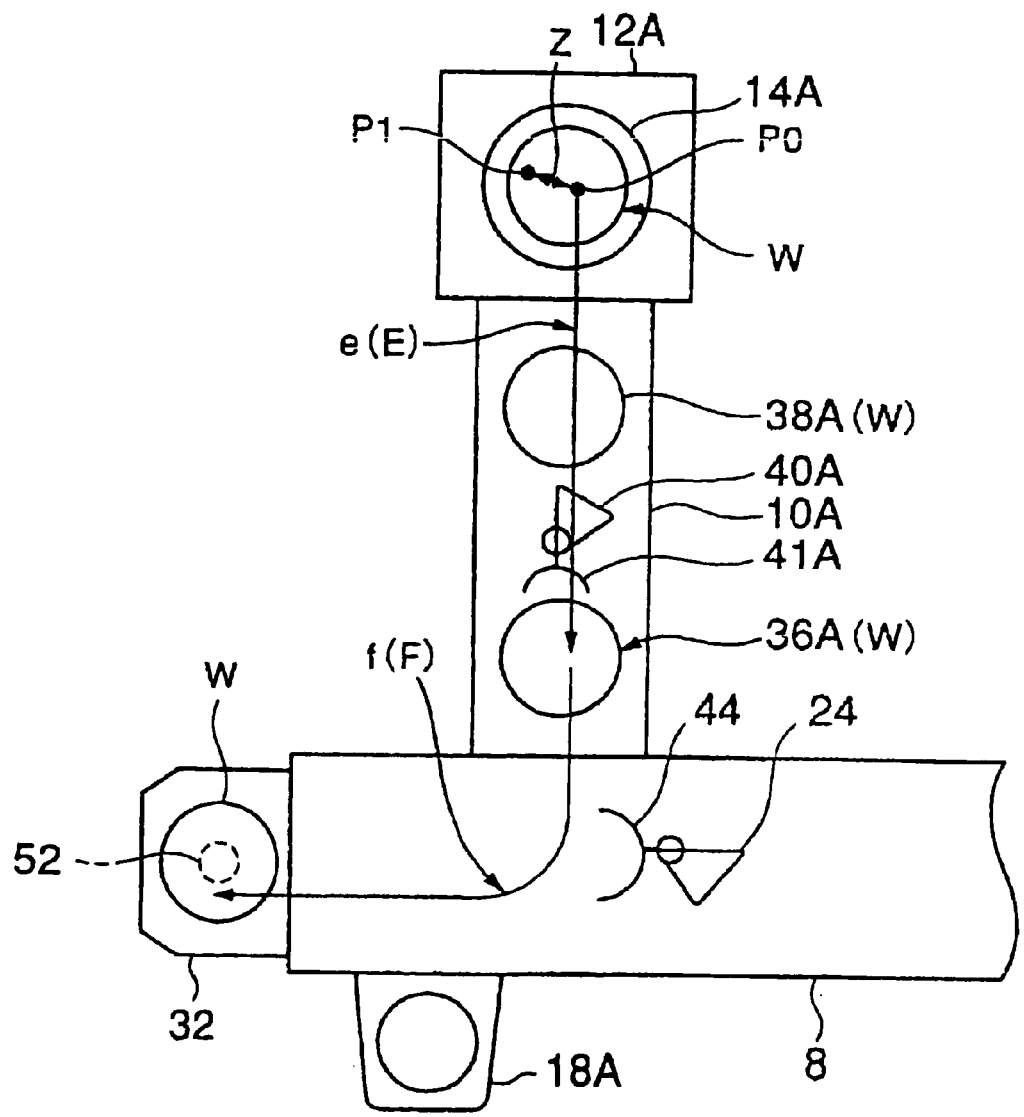
FIG. 6 is a schematic view showing an example of a moving path when a one-way position shift is obtained in an aligning method according to the present invention.
Figure 7:
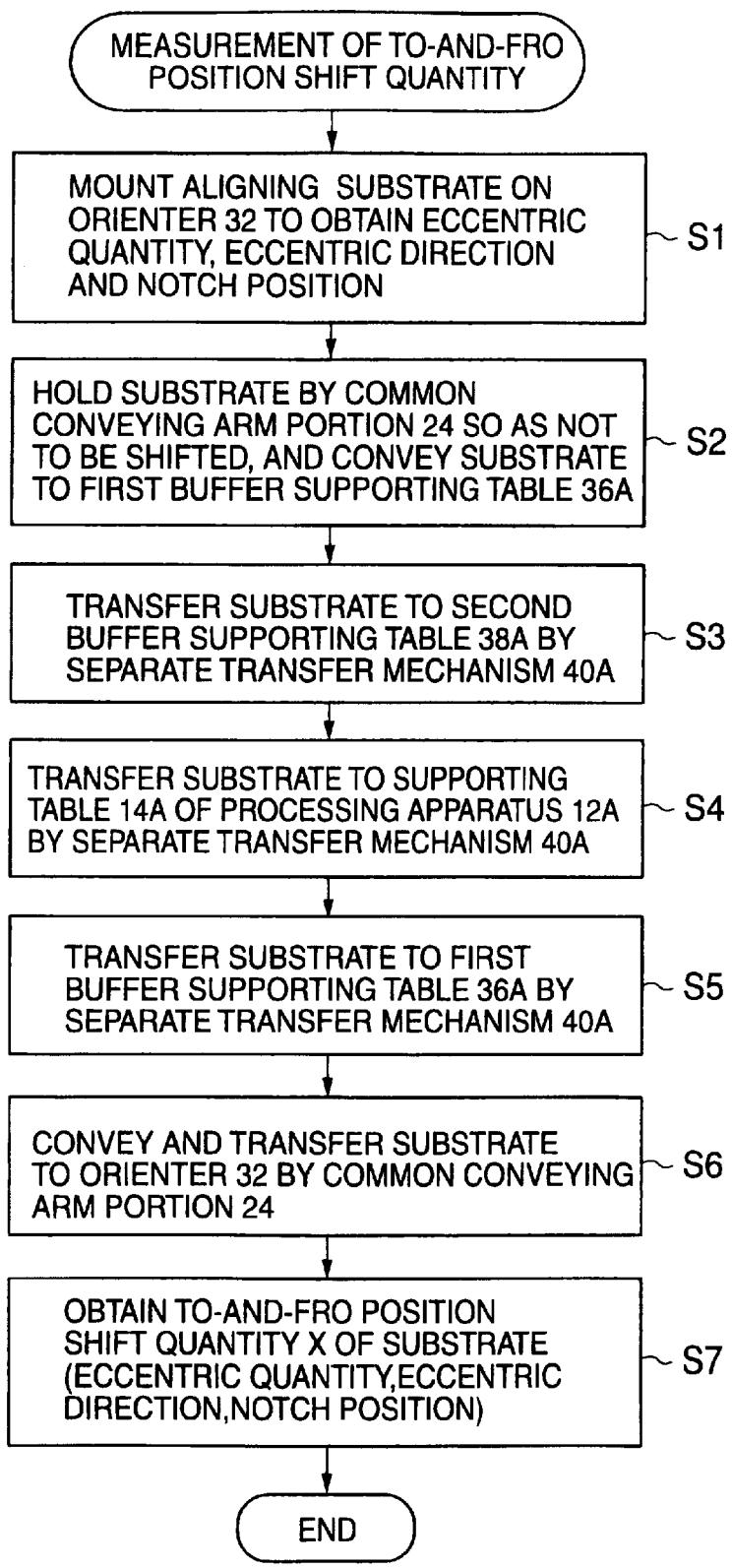
FIG. 7 is a flow chart when the moving path shown in FIG. 5 is executed.
Figure 8:
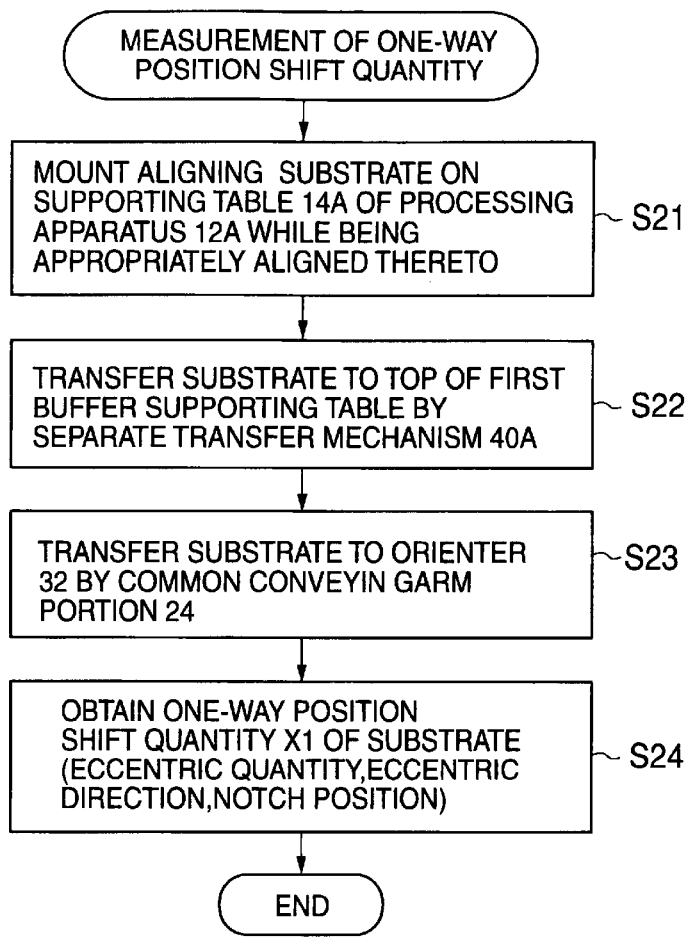
FIG. 8 is a flow chart when the moving path shown in FIG. 6 is executed.
Figure 9:
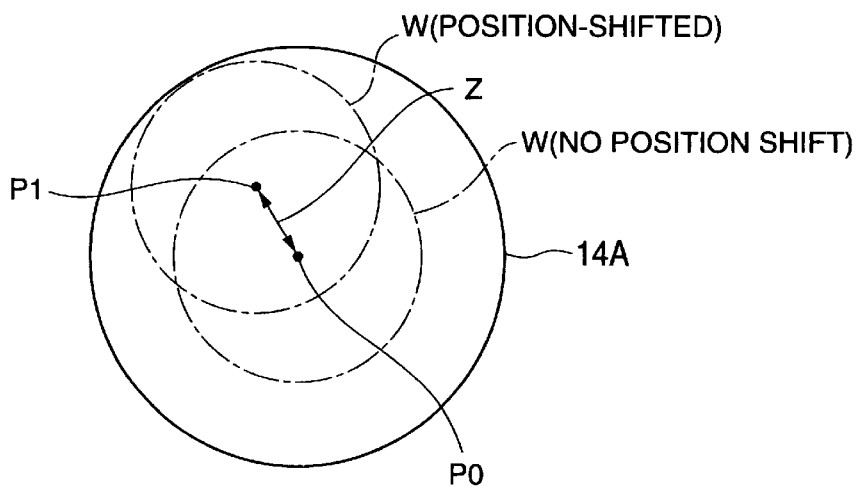
FIG. 9 is an illustration schematically showing the relationship between the center of a supporting table in a processing apparatus and the center of a semiconductor wafer, the position of which is shifted.

FIG. 4 is a schematic view showing an example of a typical moving path for wafers W during an actual process. FIG. 5 is a schematic view showing an example of a moving path when a to-and-fro position shift is obtained in an aligning method according to the present invention, and FIG. 6 is a schematic view showing an example of a moving path when a one-way position shift is obtained in an aligning method according to the present invention. FIG. 7 is a flow chart when the moving path shown in FIG. 5 is executed, and FIG. 8 is a flow chart when the moving path shown in FIG. 6 is executed. FIG. 9 is an illustration schematically showing the relationship between the center of a supporting table in a processing apparatus and the center of a semiconductor wafer, the position of which is shifted.

First, the common conveying arm portion 24 in the common transfer chamber 8 is horizontally moved in an X direction to be swiveled, bent and stretched, and vertically moved to take an unprocessed semiconductor wafer W out of a desired vessel in the three cassette vessels 18A through 18C to be horizontally moved and conveyed to the orienter to mount the wafer W on the reference table 52 of the orienter 32. In FIG. 4, the semiconductor wafer W is taken out of the cassette vessel 18A to move to the orienter 32 via a path a.

Then, the orienter 32 rotates the reference base 52 to obtain the eccentric quantity Δr (see FIG. 3) and eccentric direction of the wafer W and the rotational position (direction) of the notch 68 at that time, and cause the notch 68 to be positioned in a specific direction to stop the wafer W. Of course, all of information is stored in the control part 70.

Then, when this wafer W is intended to be taken by the common conveying arm portion 24, the wafer W is held on the fork 44 without being shifted from the fork 44, i.e., in a state that the center of the wafer W is completely and precisely coincident with the center of the fork 44, by holding the wafer in a state that the position of the fork 44 of the arm portion 24 is shifted so as to cancel the eccentric quantity Δr. That is, as well known, however great the position shift of the wafer W is within an allowable range when the wafer W is mounted on the reference table 52, the orienter 32 and the common conveying arm portion 24 are operated so that the wafer W is held on the fork 44 without being shifted from the fork 44 when the wafer is held on the fork 44 again.

Then, the common conveying arm portion 24 holding the wafer W without any position shift moves toward one of the two load-lock chambers 10A and 10B, the load-lock chamber 10A in FIG. 4. After the pressure in the load-lock chamber 10A is regulated therein, the gate valve 34A (see FIG. 1) is open, and the wafer W is mounted on the first buffer supporting table 36A. This movement is shown as a path b in FIG. 4.

Then, the wafer W on the first buffer supporting table 36A is transferred to the top of the second buffer supporting table 38A by means of the separate transfer mechanism 40A provided in the load-lock chamber 10A. This movement is shown as a path c in FIG. 4.

Then, after the pressure regulation in the load-lock chamber 10A is completed, the wafer W on the second buffer supporting table 38A is transferred to the top of the supporting table 14A in the processing apparatus 12A by means of the separate transfer mechanism 40A. This movement is shown as a path d in FIG. 4. Since this movement to the top of the supporting table 14A is carried out after carrying out alignment by teaching which will be described later, the wafer W is precisely transferred and held.

Then, after processing for the wafer W in the processing apparatus 12A for a predetermined time is completed, the processed wafer W is transferred from the top of the supporting table 14 to the top of the first buffer supporting table 36A by means of the separate transfer mechanism 40A. This movement is shown as a path e in FIG. 4. At this time, the next wafer W to be processed is on standby on the top of the second buffer supporting table 38A.

Then, the processed wafer W on the first buffer supporting table 36A is transferred to and housed in a predetermined cassette vessel, e.g., the cassette vessel 18A, by means of the common conveying arm portion 24 in the common conveying chamber 8. This movement is shown as a path g in FIG. 4.

Thus, the wafer W is moved as described above during a general process. Such moving paths are the same as those in the case of the other processing apparatus 12B.

A method for aligning a conveying position before the general process will be described below. For example, such alignment is carried out immediately after the processing system 2 is completed or when parts or the like relating to alignment of each portion are replaced.

There are some cases where a teaching operation for carrying out rough alignment so as to prevent the conveyed semiconductor wafer from interfering with other portions before precise alignment is carried out. If there is not the possibility that the semiconductor wafer interferes with other portions even if the teaching operation for carrying out rough alignment is not carried out in view of tolerance and so forth during assembly, the method for precisely aligning the conveying position according to the present invention may be directly carried out.

The features of this conveying position aligning method are as follows. First, the aligning substrate is taken out of the orienter 32 to be automatically mounted on the supporting table 14A via the paths b, c and d, and the mounted wafer W is returned to the orienter 32 via the paths e and f (see FIG. 5) which are the opposite paths to the above described paths. The position shift quantity at that time is measured by the orienter 32 to be assumed as a to-and-fro position shift quantity.

Then, the aligning substrate is precisely mounted on the supporting table 14A without any position shift by manual operations or the like. Then, this is automatically conveyed to the orienter 32 via the paths e and f (see FIG. 6), and the position shift quantity at that time is measured by the orienter 32 to be assumed as a one-way position shift quantity. Furthermore, either the one-way position shift quantity or the to-and-fro position shift quantity may be first obtained. By operating (subtracting) both position shift quantities, a modified quantity is obtained. Of course, all of these operational controls are carried out by commands from the control part 70.

Also referring to FIGS. 5 and 7, measurement of the to-and-fro position shift quantity will be described below.

Furthermore, an actual semiconductor wafer (e.g., a dummy wafer) W is herein used as the aligning substrate.

First, the aligning substrate W is mounted on the reference table 52 (see FIG. 1) of the orienter 32 by manual operations or by means of the common conveying arm portion 24 of the common conveying mechanism 20, and the eccentric quantity, eccentric direction and notch position of the aligning substrate W are obtained by rotating the aligning substrate W (S1).

Then, the substrate W on the reference table 52 is held by the common conveying arm portion 24 so as not to be shifted from the fork 44, and is conveyed along the path b to be transferred to the top of the first buffer supporting table 36A (S2). At this time, it is assumed that the position shift quantity between the substrate W and the center of the first buffer supporting table 36A is a position shift quantity B. Furthermore, this position shift quantity B can not be recognized in the control part 70.

Then, the substrate W on the first buffer supporting table 36A is conveyed along the path c to be transferred to the top of the second buffer supporting table 38A by means of the separate transfer mechanism 40A (S3). At this time, it is assumed that a newly caused position shift quantity between the substrate W and the center of the second buffer supporting table 38A is a position shift quantity C. Furthermore, this position shift quantity C can not be recognized in the control part 70.

Then, the substrate W on the second buffer supporting table 38A is conveyed along the path d to be transferred to the top of the supporting table 14A of the processing apparatus 12A by means of the separate transfer mechanism 40A (S4). At this time, it is assumed that a newly caused position shift quantity between the substrate W and the center P0 of the supporting table 14A is a position shift quantity D. It is also assumed that the center of the position-shifted wafer W on the supporting table 14A is P1. Furthermore, this position shift quantity D can not be recognized in the control part 70.

Then, the position-shifted substrate W on the supporting table 14A is conveyed along the path e to be transferred to the top of the first buffer supporting table 36A by means of the separate transfer mechanism 40A (S5). At this time, a newly caused position shift quantity between the substrate W and the center of the first buffer supporting table 36A is a position shift quantity E. Furthermore, this position shift quantity E can not be recognized in the control part 70.

Then, the substrate W on the first buffer supporting table 36A is conveyed along the path f to be transferred to the top of the reference table 52 of the orienter 32 by means of the common conveying arm portion 24 (S6). At this time, it is assumed that a newly caused position shift quantity between the substrate W and the center of the reference table 52 is a position shift quantity F. Furthermore, this position shift quantity F can not recognized in the control part 70.

Then, by obtaining the eccentric quantity, eccentric direction and notch position of the substrate W returned by rotating the reference table 52 of the orienter 32, a position shift quantity, i.e., a to-and-fro position shift quantity X, is obtained. This to-and-fro position shift quantity X is stored in the control part 70. By the way, the to-and-fro position shift quantity X is the sum of the respective position shift quantities caused when traveling along the respective paths b through f, so that the to-and-fro position shift quantity X is as follows.

$$X=B+C+D+E+F$$

Furthermore, since the moving directions and so forth of the common conveying arm portion 24 and separate transfer mechanism 40A are different between the approach route and return route of the substrate W, the approach route position shift quantity is not generally equal to the return route position shift quantity due to a back lash or the like as follows.

$$B=C+D \neq E+F$$

Also referring to FIGS. 6, 8 and 9, measurement of a one-way position shift quantity will be described below.

First, the substrate W is mounted on the supporting table 14A of the processing apparatus 12A by manual operations or the like so as to be precisely aligned (S21). At this time, the center P0 of the supporting table 14A is completely coincident with the center of the wafer W. It is assumed that the position shift quantity between the center P1 of the substrate W on the supporting table 14A and the center P0 when measuring the to-and-fro position shift quantity is Z. This state is enlarged to be shown in FIG. 9.

If the substrate W is thus mounted on the supporting table 14A so as to be precisely aligned, the substrate W is conveyed along the path e to be transferred to the top of the first buffer supporting table 36A by means of the separate transfer mechanism 40A (S22). At this time, a newly caused position shift quantity between the substrate W and the center of the first buffer supporting table 36A is a position shift quantity E as described above. Furthermore, this position shift quantity E can not be recognized in the control part 70.

Then, the substrate W on the first buffer supporting table 36A is conveyed along the path f to be transferred to the top of the reference table 52 of the orienter 32 by means of the common conveying arm portion 24 (S23). At this time, it is assumed that a newly caused position shift quantity between the substrate W and the center of the reference table 52 is a position shift quantity F as described above. Furthermore, this position shift quantity F can not recognized in the control part 70.

Then, by obtaining the eccentric quantity, eccentric direction and notch position of the substrate W returned by rotating the reference table 52 of the orienter 32, a position shift quantity, i.e., a one-way position shift quantity X1, is obtained. This one-way position shift quantity X1 is stored in the control part 70. By the way, the one-way position shift quantity X1 is the sum of the respective position shift quantities caused when traveling along the respective paths e and f, so that the one-way position shift quantity X1 is as follows.

$$X1 = E + F$$

The to-and-fro position shift quantity X and the one-way position shift quantity X1 have been obtained by measurement, and the difference between both shift quantities is as follows.

$$X - X1 = (B + C + D + E + F) - (E + F) = B + C + D$$

The above described (B+C+D) is a position shift quantity when the wafer W on the reference table 52 is conveyed along the paths b, c and d to be mounted on the supporting table 14A, and is equal to Z (see FIG. 9) which is the position shift quantity between the center P1 of the wafer W and the point P0.

Therefore, the mounting position may be corrected (specifically, transformation of coordinate system) in any one of the paths b, c and d so as to cancel the position shift quantity Z. This operation is naturally carried out by the control part 70, and the corrected mounting position is stored as new position coordinates to end the teaching operation. Of course, the above described position shift quantities are vector quantities.

The above described correction of the mounting position may be carried out when the wafer is held by the arm portion 24 or the separate transfer mechanism 40A or when the wafer is mounted. For the reason that the common conveying mechanism 20 moves in all directions of X, R and θ, the position shift quantity Z may be corrected when the wafer W is transferred from the orienter 32 to the top of the first buffer supporting table 36A.

The to-and-fro position shift quantity X has been described above so that the eccentric quantity and so forth obtained by the orienter 32 at step S1 are zero. When the eccentric quantity and so forth are not zero, the eccentric quantity and so forth are corrected when the aligning substrate is transferred from the orienter to the top of the first buffer supporting table 36A (S2). Therefore, the eccentric quantity and so forth are not included in the to-and-fro position shift quantity X.

Of course, such a teaching operation for aligning a conveying position is also carried out with respect to the other processing apparatus 12B. If the common conveying arm portion 24 is provided with two forks 44, the same aligning teaching operation as the above described operation is carried out with respect to each of the forks 44.

As described above, even if the position shift quantities in the middle of the wafer conveying paths, e.g., the position shift quantities B, C, D and the position shift quantities E and F, are not recognized, the conveying position aligning teaching operation on the supporting tables 14A and 14B of the respective processing apparatuses 12A and 12B can be precisely and rapidly carried out only by means of the orienter 32.

Since it is not required to carry out conveying position alignment on the first and second buffer supporting tables 36A, 36B, 38A and 38B provided in the middle of the paths, the teaching operation can be rapidly carried out.

After a teaching operation for the processing system 2 was actually carried out by the above described conveying position aligning method, alignment was carried out with a high precision of about 0.1 to 0.2 mm.

While the processing system of a type that the processing apparatuses 12A and 12B are separately connected to the quadrate common transfer chamber 8 via the load-lock chambers 10A and 10B has been described as an example, the present invention should not be limited to the processing system of this type, but the invention may be applied to all of processing systems including the orienter 32. Therefore, of course, the present invention may be applied to a so-called cluster tool type processing system wherein a plurality of processing apparatuses and an orienter are connected to the respective sides of a polygonal, e.g., quadrangular or hexagonal, common transfer chamber, or a processing system of a type that the above described common transfer chamber includes an orienter.

While the semiconductor wafer W has been used as a processing object, the present invention should not be limited thereto, but the invention may be applied to a glass substrate, an LCD substrate or the like.

As described above, according to a method for aligning the conveying position of a processing system for processing a processing object, and a processing system for processing a processing object, according to the present invention, it is possible to provide the following excellent effects.

According to the present invention, the conveying position when conveying the processing object toward the mounting table is corrected on the basis of the to-and-fro position shift quantity caused when the to-and-fro conveyance of the processing object is carried out between the reference table of the orienter/positioner and the supporting table of the processing apparatus, and on the basis of the one-way position shift quantity caused when the one-way conveyance of the processing object from the supporting table toward the reference table, so that the teaching operation can be rapidly and precisely carried out without individual differences.

During alignment in the teaching operation, the aligning substrate is conveyed at the same conveying speed as that during process, and adjustment for delicately moving the aligning substrate forward and backward by manual operations is not carried out. Therefore, it is possible to precisely carry out alignment without causing position errors caused by the difference in inertia force and position errors caused by a back lash.

Even if a plurality of transfer mechanisms and buffer supporting tables are provided in the middle of the conveying path, it is not required to carry out alignment on each buffer supporting table. Therefore, it is possible to greatly shorten the time required to carry out alignment in the teaching operation.

Since the actual processing object is used unlike the conventional case where the plastic plate or the like is used as the aligning substrate, the thickness, dimension and rigidity are the same as those of the processing object during process. Therefore, the deflection quantity and so forth during alignment in the teaching operation are the same, so that it is possible to more precisely carry out alignment.

What is claimed is:

1. A method for aligning a conveying position of a processing system for processing a processing object, said processing system comprising a processing apparatus which has a supporting table for supporting thereon the processing object and which serves to carry out a predetermined processing for the processing object, an orienter/positioner for detecting an eccentric quantity and eccentric direction of the processing object mounted on a reference table, and at least one transfer mechanism which is provided between the orienter/positioner and the processing apparatus, the method comprising the steps of:

detecting an eccentric quantity and eccentric direction of an aligning substate mounted on the reference table and obtaining a position shift quantity of the aligning substrate when the transfer mechanism causes the to-and-fro conveyance of the aligning substrate between the reference table and the supporting table to return the aligning substrate, as a to-and-fro position shift quantity;

obtaining a position shift quantity of the aligning substrate when the aligning substrate precisely aligned to be mounted on the supporting table is conveyed to the reference table by the transfer mechanism, as a one-way position shift quantity; and modifying a conveying position of a processing object, which is conveyed toward the supporting table by the transfer mechanism, on the basis of the to-and-fro position shift quantity and the one-way position shift quantity.

2. A method for aligning a conveying position of a processing system for processing a processing object, as set forth in claim 1, wherein the processing system has a plurality of processing apparatuses, each of which is said processing apparatus, for modifying the conveying position with respect to a conveying path to each of the supporting tables.

3. A method for aligning a conveying position of a processing system for processing a processing object, as set forth in claim 1, wherein the basis on which the conveying position of the processing object is modified corresponds to a difference between the to-and-fro position shift quantity and the one-way position shift quantity.

4. A method for aligning a conveying position of a processing system for processing and processing object, as set forth in claim 1, wherein a plurality of transfer mechanism are provided between the orienter/positioner and each of the processing apparatus, and a buffer supporting table for causing the processing object to be standby on the way is provided therebetween, the aligning substrate being conveyed by means of the plurality of transfer mechanism and the buffer supporting table.

5. A method for aligning a conveying position of a processing system for processing a processing object, as set forth in claim 1, wherein an actual processing object is used as the aligning substrate.

6. A processing system for processing a processing object, said processing system comprising:

a processing apparatus which has a supporting table for supporting thereon a processing object and which serves to carry out a predetermined processing for the processing object;

an orienter/positioner for detecting an eccentric quantity and eccentric direction of an aligning substrate mounted on the reference table and for detecting an eccentric quantity and eccentric direction of the processing object mounted on a reference table; at least one transfer mechanism which is provided between the orienter/positioner and the processing apparatus; and a control part for controlling the transfer mechanism and the orienter/positioner, wherein the control part obtains a position shift quantity of the aligning substrate when the transfer mechanism causes the to-and-fro conveyance of the aligning substrate between the reference table and the supporting table to return the aligning substrate, as a to-and-fro position shift quantity, and obtains a position shift quantity of the aligning substrate when the aligning substrate precisely aligned to be mounted on the supporting table is conveyed to the reference table by the transfer mechanism, as a one-way position shift quantity, the control part modifying a conveying position of a processing object, which is conveyed toward the supporting table by the transfer mechanism, on the basis of the to-and-fro position shift quantity and the one-way position shift quantity.

7. A processing system for processing a processing object, as set forth in claim 6, wherein a plurality of processing apparatus, each of which is said processing apparatus, are provided, and the transfer mechanism comprises:

a common conveying mechanism which is commonly used for each of the processing apparatuses; and separate transfer mechanism, each of which is provided so as to correspond to each of the processing apparatuses, each of the separate transfer mechanisms being provided with a buffer supporting table for temporarily supporting thereon the processing object.

* * * * *